United States Patent
Chen et al.

(10) Patent No.: US 9,543,210 B2
(45) Date of Patent: Jan. 10, 2017

(54) FORMING CROWN ACTIVE REGIONS FOR FINFETS

(71) Applicant: Taiwan Semiconductor Manufacturing Company, Ltd., Hsin-Chu (TW)

(72) Inventors: Chen-Ping Chen, Toucheng Township (TW); Hui-Min Lin, Zhubei (TW); Ming-Jie Huang, Hsin-Chu (TW); Tung Ying Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/846,754

(22) Filed: Sep. 5, 2015

(65) Prior Publication Data
US 2015/0380315 A1 Dec. 31, 2015

Related U.S. Application Data

(62) Division of application No. 12/874,039, filed on Sep. 1, 2010, now Pat. No. 9,130,058.

(51) Int. Cl.
*H01L 29/00* (2006.01)
*H01L 21/8234* (2006.01)
(Continued)

(52) U.S. Cl.
CPC ......... *H01L 21/823431* (2013.01); *H01L 21/823437* (2013.01); *H01L 21/823481* (2013.01);
(Continued)

(58) Field of Classification Search
CPC ............. H01L 21/823431; H01L 21/823821; H01L 29/423; H01L 29/42316
See application file for complete search history.

(56) References Cited

U.S. PATENT DOCUMENTS 6,522,562 B2    2/2003  Foss
6,541,351 B1    4/2003  Bartlau et al.
(Continued)

FOREIGN PATENT DOCUMENTS

JP    2002118255 A    4/2002
JP    2005510080 A    4/2005
(Continued)

OTHER PUBLICATIONS

Ahn, Young Joon, et al., "Hot Carrier Generation and Reliability of BT (Body-tied)—Fin Type SRAM Cell Transistors (Wfin=20~70nm)," 43rd Annual International Reliability Physics Symposium, Apr. 17-21, 2005, pp. 352-355.
(Continued)

*Primary Examiner* — William Harriston
(74) *Attorney, Agent, or Firm* — Slater Matsil, LLP

(57) ABSTRACT

A method includes forming a first mask over a substrate through a double patterning process, wherein the first mask comprises a horizontal portion and a plurality of vertical portions protruding over the horizontal portion, and wherein the vertical portions are spaced apart from each other, applying a first etching process to the first mask until a top surface of a portion of the substrate is exposed, applying a second etching process to the substrate to form intra-device openings and inter-device openings, wherein the inter-device openings are formed at the exposed portion of the substrate, filling the inter-device openings and the intra-device openings to form inter-device insulation regions and intra-device insulation regions and etching back the inter-device insulation regions and the intra-device insulation regions to form a plurality of fins protruding over top surfaces of the inter-device insulation regions and the intra-device insulation regions.

20 Claims, 13 Drawing Sheets

(51) Int. Cl.
*H01L 29/66* (2006.01)
*H01L 29/78* (2006.01)

(52) U.S. Cl.
CPC ...... *H01L 29/66795* (2013.01); *H01L 29/785* (2013.01); *H01L 29/7848* (2013.01)

(56) References Cited

U.S. PATENT DOCUMENTS

| | | |
|---|---|---|
| 6,548,859 B2 | 4/2003 | Maegawa |
| 6,706,571 B1 | 3/2004 | Yu et al. |
| 6,734,107 B2 | 5/2004 | Lai et al. |
| 6,737,359 B1 | 5/2004 | Yang et al. |
| 6,858,478 B2 | 2/2005 | Chau et al. |
| 7,056,781 B2 | 6/2006 | Yoon et al. |
| 7,190,050 B2 | 3/2007 | King et al. |
| 7,247,887 B2 | 7/2007 | King et al. |
| 7,265,008 B2 | 9/2007 | King et al. |
| 7,291,560 B2 | 11/2007 | Parascandola et al. |
| 7,508,031 B2 | 3/2009 | Liu et al. |
| 7,528,465 B2 | 5/2009 | King et al. |
| 7,588,985 B2 | 9/2009 | Kim |
| 7,605,449 B2 | 10/2009 | Liu et al. |
| 7,678,632 B2 | 3/2010 | Gossner et al. |
| 7,745,319 B2 | 6/2010 | Tang et al. |
| 7,749,913 B2 | 7/2010 | Omura et al. |
| RE41,941 E | 11/2010 | Eckert et al. |
| 7,879,665 B2 | 2/2011 | Smith et al. |
| 7,915,693 B2 | 3/2011 | Okano |
| 7,989,355 B2 | 8/2011 | Shieh et al. |
| 7,998,813 B2 | 8/2011 | Haller et al. |
| 8,003,310 B2 | 8/2011 | Sandhu et al. |
| 8,062,963 B1 | 11/2011 | van Dal |
| 2005/0153490 A1 | 7/2005 | Yoon et al. |
| 2005/0285204 A1 | 12/2005 | Kim et al. |
| 2006/0258162 A1 | 11/2006 | Abatchev et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0161251 A1 | 7/2007 | Tran et al. |
| 2007/0228372 A1 | 10/2007 | Yang et al. |
| 2007/0241414 A1 | 10/2007 | Narihiro |
| 2008/0116515 A1 | 5/2008 | Gossner et al. |
| 2008/0258228 A1 | 10/2008 | Chuang et al. |
| 2008/0263492 A1 | 10/2008 | Chuang et al. |
| 2008/0290470 A1 | 11/2008 | King et al. |
| 2008/0296632 A1 | 12/2008 | Moroz et al. |
| 2009/0035909 A1 | 2/2009 | Chang et al. |
| 2009/0181477 A1 | 7/2009 | King et al. |
| 2010/0006945 A1 | 1/2010 | Merelle et al. |
| 2010/0006974 A1 | 1/2010 | Xu et al. |
| 2010/0052059 A1 | 3/2010 | Lee |
| 2010/0109086 A1 | 5/2010 | Song et al. |
| 2010/0183961 A1 | 7/2010 | Shieh et al. |
| 2010/0203734 A1 | 8/2010 | Shieh et al. |
| 2010/0264468 A1 | 10/2010 | Xu |
| 2011/0008969 A1 | 1/2011 | Bencher et al. |
| 2011/0073919 A1 | 3/2011 | Pawlak |
| 2011/0101421 A1 | 5/2011 | Xu |
| 2011/0117679 A1 | 5/2011 | Lee et al. |
| 2011/0147846 A1 | 6/2011 | Su et al. |
| 2011/0193141 A1 | 8/2011 | Lin et al. |
| 2011/0278676 A1 | 11/2011 | Cheng et al. |
| 2011/0282478 A1 | 11/2011 | Shen et al. |
| 2011/0283245 A1 | 11/2011 | Shen et al. |
| 2011/0317477 A1 | 12/2011 | Liaw |
| 2011/0317485 A1 | 12/2011 | Liaw |
| 2012/0001197 A1 | 1/2012 | Liaw et al. |
| 2012/0001232 A1 | 1/2012 | Liaw |
| 2012/0001266 A1 | 1/2012 | Lim et al. |
| 2012/0009690 A1 | 1/2012 | Wann et al. |
| 2012/0012932 A1 | 1/2012 | Perng et al. |
| 2012/0018848 A1 | 1/2012 | Huang et al. |
| 2012/0049282 A1 | 3/2012 | Chen et al. |
| 2012/0049294 A1 | 3/2012 | Chen et al. |
| 2012/0091511 A1 | 4/2012 | Chen et al. |
| 2012/0091528 A1 | 4/2012 | Chang et al. |
| 2012/0100673 A1 | 4/2012 | Shieh |
| 2012/0104472 A1 | 5/2012 | Xu et al. |
| 2012/0126325 A1 | 5/2012 | Wang et al. |
| 2012/0126326 A1 | 5/2012 | Wang et al. |
| 2012/0126375 A1 | 5/2012 | Wang et al. |

FOREIGN PATENT DOCUMENTS

| | | |
|---|---|---|
| JP | 2009004769 A | 1/2009 |
| JP | 2009032955 A | 2/2009 |

OTHER PUBLICATIONS

Ahn, Young Joon, et al., "Trap Layer Engineered FinFET NAND Flash with Enhanced Memory Window," Symposium on VLSI Technology, 2006, pp. 88-89.

Byun, Hyun-Sook, et al., "3-Dimensional Analysis on the GIDL Current of Body-Tied Triple Gate FinFET," International Conference on Simulation of Semiconductor Processes and Devices, Sep. 6-8, 2006, pp. 267-270.

Cho, E.S., et al., "Optimized Cell Structure for FinFET Array Flash Memory," Proceeding of the 34th European Solid-State Device Research Conference, Sep. 21-23, 2004, pp. 289-292.

Cho, Eun Suk, et al., "Reliability of sub 30NM BT (Body-Tied)-FinFET with HFSION /Poly Silicon Gate Stack for Symmetric Vth Control," 44th Annual International Reliability Physics Symposium Proceedings, Mar. 26-30, 2006, pp. 663-664.

Cho, Eun Suk, et al., "Technology Breakthrough of Body-Tied FinFET for sub 50 nm NOR Flash Memory," Symposium on VLSI Technology, 2006, pp. 90-91.

Cho, Hye Jin, et al., "Fin Width Scaling Criteria of Body-Tied FinFET in Sub-50 nm Regime," Conference Digest Device Research Conference, Jun. 21-23, 2004, vol. 1, pp. 209-210.

Cho, Hye Jin, et al., "The Vth Controllability of 5nm Body-Tied CMOS FinFET," IEEE VLSI-TSA International Symposium on VLSI Technology, Apr. 25-27, 2005, pp. 116-117.

Choe, Jeong-Dong, et al., "Low Voltage Program/Erase Characteristics of Si Nanocrystal Memory with Damascene Gate FinFET on Bulk Si Wafer," Journal of Semiconductor Technology and Science, vol. 6, No. 2, Jun. 2006, pp. 68-73.

Choe, J.D., et al., "Hybrid Nanocrystal FinFET with Large P/E Window for MLC NAND Flash Memory Application," Electronic Letters, vol. 43, No. 9, Apr. 26, 2007, pp. 545-546.

Choe, Jeong-Dong, et al., "Charge Trapping WN Nano-dots with/or Without Nitride Sub-Layer for FinFET FLASH Memory," 64th Device Research Conference, 2006, pp. 273-274.

Groeseneken, G., et al., "Reliability Issues in MuGFET Nanodevices," IEEE International Reliability Physics Symposium, Apr. 27, 2008-May 1, 2008, pp. 52-60.

Han, Jin-Woo, et al., "Body Thickness Dependence of Impact Ionization in a Multiple-Gate FinFET," IEEE Electron Devices Letters, vol. 28, No. 7, Jul. 2007, pp. 625-627.

Han, Jin-Woo, et al., "Body Effects in Tri-Gate Bulk FinFETs for DTMOS," IEEE Nanotechnology Materials and Devices Conference, vol. 1, Oct. 22-25, 2006, pp. 208-209.

Hoffmann, T., et al., "GIDL (Gate-Induced Drain Leakage) and Parasitic Schottky Barrier Leakage Elimination in Aggressively Scaled HfO2/TiN FinFET Devices," IEEE International Electron Devices Meeting, Dec. 5, 2005, pp. 725-728.

Kim, Kinam, et al., "Memory Technology in the Future," Microelectronic Engineering 84, 2007, pp. 1976-1981.

Kim, Sukpil, et al., "Paired FinFET Charge Trap Flash Memory for Vertical High Density Storage," Symposium on VLSI Technology, 2006, pp. 84-85.

Kim, Sung Min, et al., "A Novel Multi-Channel Field Effect Transistor (McFET) on Bulk Si for High Performance Sub-80nm Application," IEEE International Electron Devices Meeting, Dec. 13-15, 2004, pp. 639-642.

(56) References Cited

OTHER PUBLICATIONS

Kim, Yong-Sung, et al., "Fabrication and Electrical Properties of Local Damascene FinFET Cell Array in Sub-60nm Feature Sized DRAM," Journal of Semiconductor Technology and Science, vol. 6, No. 2, Jun. 2006, pp. 61-67.

Kim, Yong-Sung, et al., "Local-Damascene-FinFET DRAM Integration with p+ Doped Poly-Silicon Gate Technology for sub-60nm Device Generations," IEEE International Electron Devices Meeting, Dec. 5, 2005, pp. 315-318.

Koo, June-Mo, et al., "Vertical Structure NAND Flash Array Integration with Paired FinFET Multi-bit Scheme for High-density NAND Flash Memory Application," Symposium on VLSI Technology, Jun. 17-19, 2008, pp. 120-121.

Kwon, Wookhyun, et al., "3-D Channel Structure Flash Having Short Channel Effect Immunity and Low Random Telegraph Signal Noise," Joint Non-Volatile Semiconductor Memory Worshop and International Conference on Memory Technology and Design, May 18-22, 2008, pp. 20-21.

Lee, Choong-Ho, et al., "The Application of BT-FinFET Technology for Sub 60nm DRAM Integration," International Conference on Integrated Circuit and Technology, May 9-11, 2005, pp. 37-41.

Lee, Chul, et al., "Enhanced Data Retention of Damascene-finFET DRAM with Local Channel Implantation and <100> Fin Surface Orientation Engineering," IEEE International Electron Devices Meeting, Dec. 13-15, 2004, pp. 61-64.

Lee, Chul, et al., "Study on the Retention Time of Body Tied FinFET DRAM with <100> Channel Directional Wafer," 44th Annual International Reliability Physics Symposium Proceedings, Mar. 26-30, 2006, pp. 717-718.

Lee, Deok-Hyung, et al., "Improved Cell Performance for sub-50 nm DRAM with Manufacturable Bulk FinFET Structure," IEEE Symposium on VLSI Technology, Jun. 12-14, 2007, pp. 164-165.

Lee, Hyunjin, et al., "The Influence of Gate Poly-Silicon Oxidation on Negative Bias Temperature Instability in 3D FinFET," 45th Annual International Reliability Physics Symposium, Apr. 15-19, 2007, pp. 680-681.

Lee, Jong Jin, et al., "Retention Reliability of FinFET SONOS Device," 44th Annual International Reliability Physics Symposium Proceedings, Mar. 26-30, 2006, pp. 530-533.

Lee, Se Hoon, et al., "Improved Post-Cycling Characteristic of FinFET NAND Flash," International Electron Devices Meeting, Dec. 11-13, 2006, 4 pages.

Oh, Chang Woo, et al., "Damascene Gate FinFET SONOS Memory Implemented on Bulk Silicon Wafer," IEEE International Electron Devices Meeting, Dec. 13-15, 2004, pp. 893-896.

Suk, Sung Dae, et al., "Characteristics of sub 5nm Tri-Gate Nanowire MOSFETs with Single and Poly Si Channels in SOI Structure," Symposium on VLSI Technology, Jun. 16-18, 2009, pp. 142-143.

Sung, Suk-Kang, et al., "Fully Integrated SONOS Flash Memory Cell Array with BT (Body Tied)-FinFET Structure," IEEE Transactions on Nanotechnology, vol. 5, No. 3, May 2006, pp. 174-179.

Sung, Suk-Kang, et al., "SONOS-type FinFET Device Using P+ Poly-Si Gate and High-k Blocking Dielectric Integrated on Cell Array and GSL/SSL for Multi-Gigabit NAND Flash Memory," Symposium on VLSI Technology, 2006 pp. 86-87.

Trivedi, V.P., et al., "Source/Drain-Doping Engineering for Optimal Nanoscale FinFET Design," IEEE International SOI Conference, Oct. 4-7, 2004, pp. 192-194.

Veloso, A., et al., "Demonstration of Scaled 0.099μm2 FinFET 6T-SRAM Cell Using Full-Field EUV Lithography for (Sub-)22nm Node Single-Patterning Technology," IEEE International Electron Devices Meeting, Dec. 7-9, 2009, 4 pages.

Veloso, A., et al., "Flexible and Robust Capping-Metal Gate Integration Technology Enabling Multiple-VT CMOS in MuGFETs," Symposium on VLSI Technology, Jun. 17-19, 2008, pp. 14-15.

Witters, L., et al., "Treshold Voltage Modulation in FinFET Devices Through Arsenic Ion Implantation into TiN/HfSiON Gate Stack," IEEE International SOI Conference Proceedings, Oct. 1-4, 2007, pp. 31-32.

Woo, Dong-Soo, et al., "Electrical Characteristics of FinFET with Vertically Nonuniform Source/Drain Doping Profile," IEEE Transactions on Nonotechnology, vol. 1, No. 4, Dec. 2002, pp. 233-237.

Yoshida, Makoto, et al., "A Full FinFET DRAM Core Integration Technology Using a Simple Selective Fin Formation Technique," Symposium on VLSI Technology, 2006, pp. 34-35.

FORMING CROWN ACTIVE REGIONS FOR FINFETS

This application is a divisional of U.S. patent application Ser. No. 12/874,039, entitled "Forming Crown Action Regions for FinFETs," filed on Sep. 1, 2010, which application is incorporated herein by reference.

CROSS-REFERENCE TO RELATED APPLICATION

This application relates to the following U.S. patent application Ser. No. 12/843,728, filed Jul. 26, 2010, and entitled "Cross OD FinFET Patterning," which application is hereby incorporated herein by reference.

TECHNICAL FIELD

This application relates generally to integrated circuits, and more particularly to fin field-effect transistors (FinFETs) and methods of forming the same.

BACKGROUND

With the increasing down-scaling of integrated circuits and increasingly demanding requirements to the speed of integrated circuits, transistors need to have higher drive currents with smaller dimensions. Fin field-effect transistors (FinFET) were thus developed. FinFET transistors have increased channel widths, which channels include the channels formed on the sidewalls of the fins and the channels on the top surfaces of the fins. Since the drive currents of transistors are proportional to the channel widths, the drive currents of FinFETs are increased.

To maximize the channel width of a FinFET, the FinFET may include multiple fins, with the ends of the fins connected to a same source and a same drain. In conventional processes, the formation of a multi-fin FinFET include forming a plurality of fins parallel to each other, forming a gate stack on the plurality of fins, and interconnecting the ends of the plurality of fins to form a source region and a drain region. An epitaxy process may be performed to grow a semiconductor material so that the ends of the plurality of fins merge with each other to form block source and drain regions. Source and drain contact plugs are then formed to connect to the block source and drain regions. This method, however, suffers from gap filling problems. For example, the distance between the fins that belong to the same FinFET is typically very small. Accordingly, it is difficult to perform the gap-filling to fill a dielectric material into the space between the fins.

SUMMARY

In accordance with one aspect, a device includes a plurality of intra-device insulation regions having a first height; and a plurality of semiconductor fins horizontally spaced apart from each other by the plurality of intra-device insulation regions. A portion of the plurality of semiconductor fins is disposed above the plurality of intra-device insulation regions. The device further includes a first inter-device insulation region and a second inter-device insulation region with the plurality of semiconductor fins disposed therebetween. The first and the second inter-device insulation regions have a second height greater than the first height.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel method for forming semiconductor fins, which may be used for forming fin field-effect transistors (FinFETs) and shallow trench isolation (STI) regions, is provided in accordance with various embodiments. The intermediate stages of manufacturing various embodiments are illustrated. Throughout the various views and illustrative embodiments, like reference numbers are used to designate like elements.

Figure 1A:
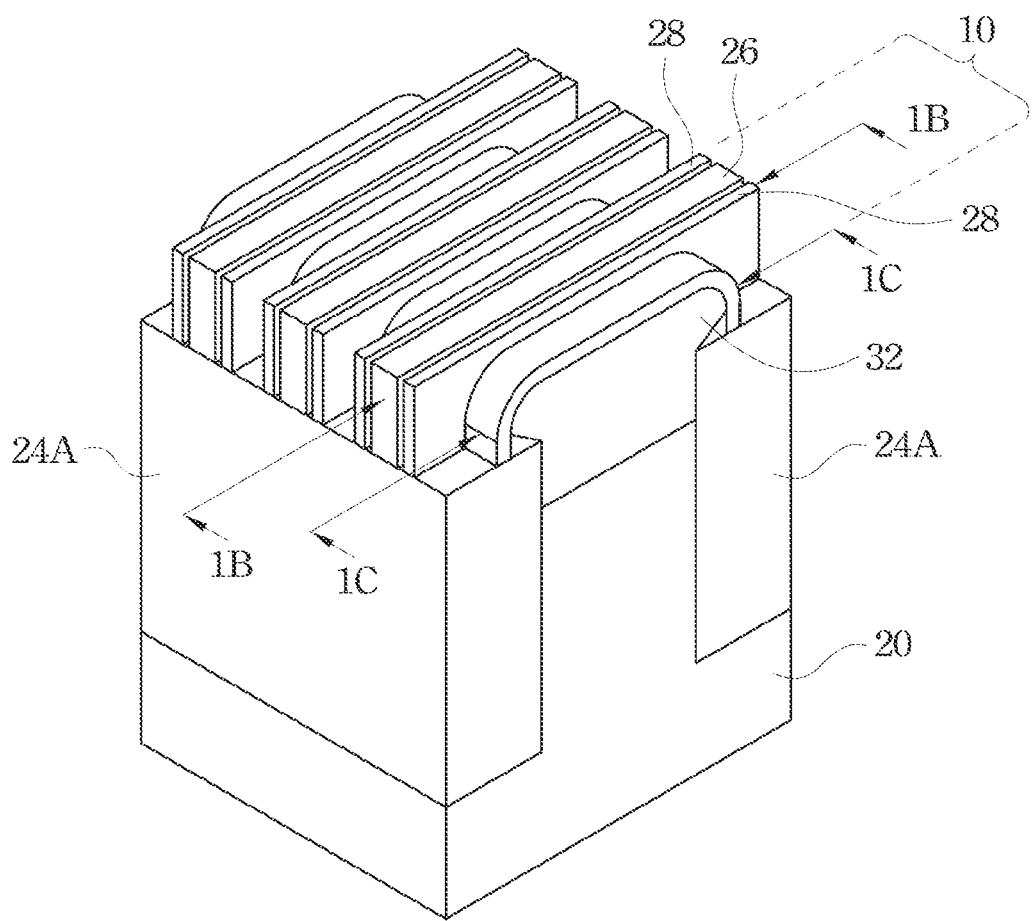
FIG. 1A through 1C illustrate a perspective view and cross-sectional views of a fin field-effect transistor (FinFET) in accordance with an embodiment.
Figure 1B:
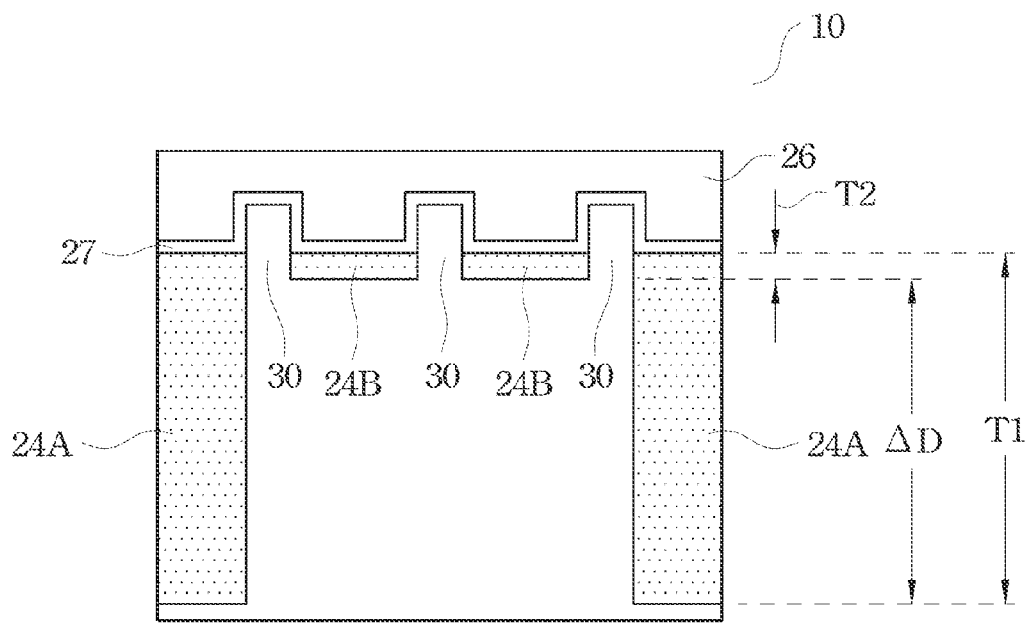
Figure 1C:
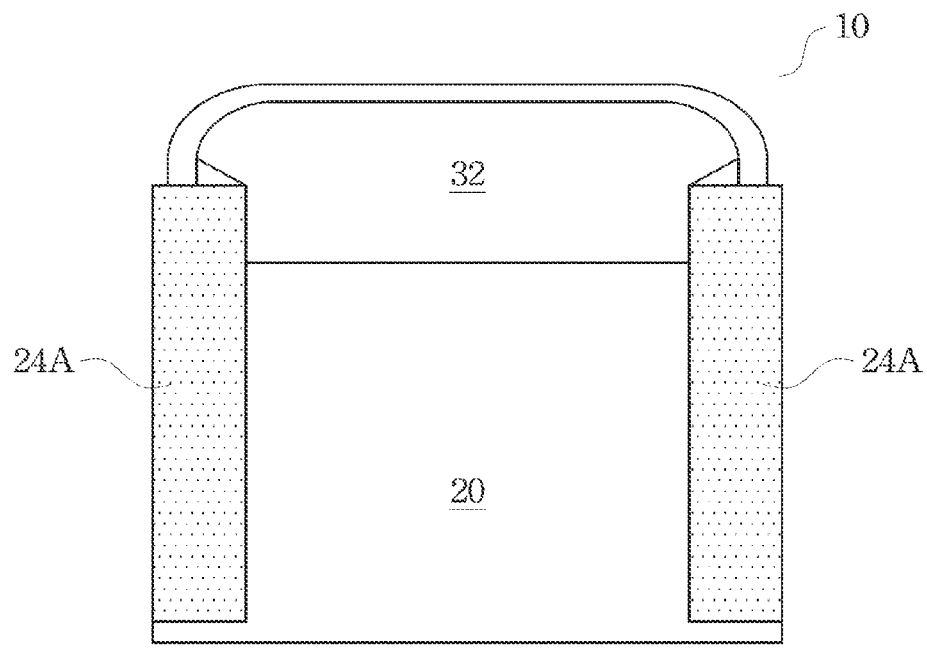

FIGS. 1A through 1C illustrate a perspective view and cross-sectional views of FinFET 10, which is a multi-fin FinFET comprises a plurality of fins 30 (not shown in FIG. 1A, please refer to FIG. 1B). FinFET 10 is formed on semiconductor substrate 20, wherein fins 30 may be formed from semiconductor substrate 20. Gate electrode 26 is formed on the plurality of fins. FinFET 10 further includes source/drain region 32, and gate spacers 28 (FIG. 1A). Insulation regions 24A, which may be STI regions, are shown in FIG. 1A, and are referred to as inter-device STI regions hereinafter.

FIG. 1B illustrates a cross-sectional view of FinFET 10 as shown in FIG. 1A, wherein the cross-sectional view is taken along a plane crossing line 1B-1B in FIG. 1A, which plane crosses gate electrode 26 and gate dielectric 27. As shown in FIG. 1B, gate electrode 26 and gate dielectric 27 are formed on the top surfaces and sidewalls of fins 30. Intra-device STI regions 24B are formed between fins 30, while inter-device STI regions 24A are formed to space FinFET 10 apart from other FinFETs (not shown). Height T1 of inter-device STI regions 24A is greater than height T2 of intra-device STI regions 24B. A ratio of height T1 to height T2 may be greater than 1.2, greater than about 1.5, greater than about 2.0, or even greater than about 4.0. Further, the top surfaces of inter-device STI regions 24A may be substantially leveled with the top surfaces of intra-device STI regions 24B, with the difference less than 10 percent of height T2, for example. On the other hand, bottom surfaces of intra-device STI regions 24B and bottom surfaces of inter-device STI regions 24A may have a vertical distance ΔD greater than about 10 nm, or even greater than about 550 nm. In an embodiment, inter-device STI regions 24A and intra-device STI regions 24B may be formed of silicon oxide or other known dielectric materials. It is observed that fins 30 and an underlying portion of semiconductor substrate 20 in combination have a crown shape, and hence the respective active region (alternatively referred to OD) is referred to as a crown OD.

FIG. 1C illustrates a cross-sectional view of FinFET 10, wherein the cross-sectional view is taken along a plane crossing line 1C-1C in FIG. 1A, which plane crosses source/drain region 32. In an embodiment, fins 30 are removed from the plane as shown in FIG. 1C, and source/drain stressors, such as SiGe, SiC, III-V compound semiconductors, or the like, may be re-grown to form source/drain region 32. Similarly, intra-device STI regions 24B are also removed from the plane as shown in FIG. 1C, although they are formed in the plane before being removed. Accordingly, bulk source/drain region 32 is formed. With the formation of bulk source/drain region 32, the stress in the channel region of FinFET 10 is improved, resulting in an increase in the drive current.

Figure 2:
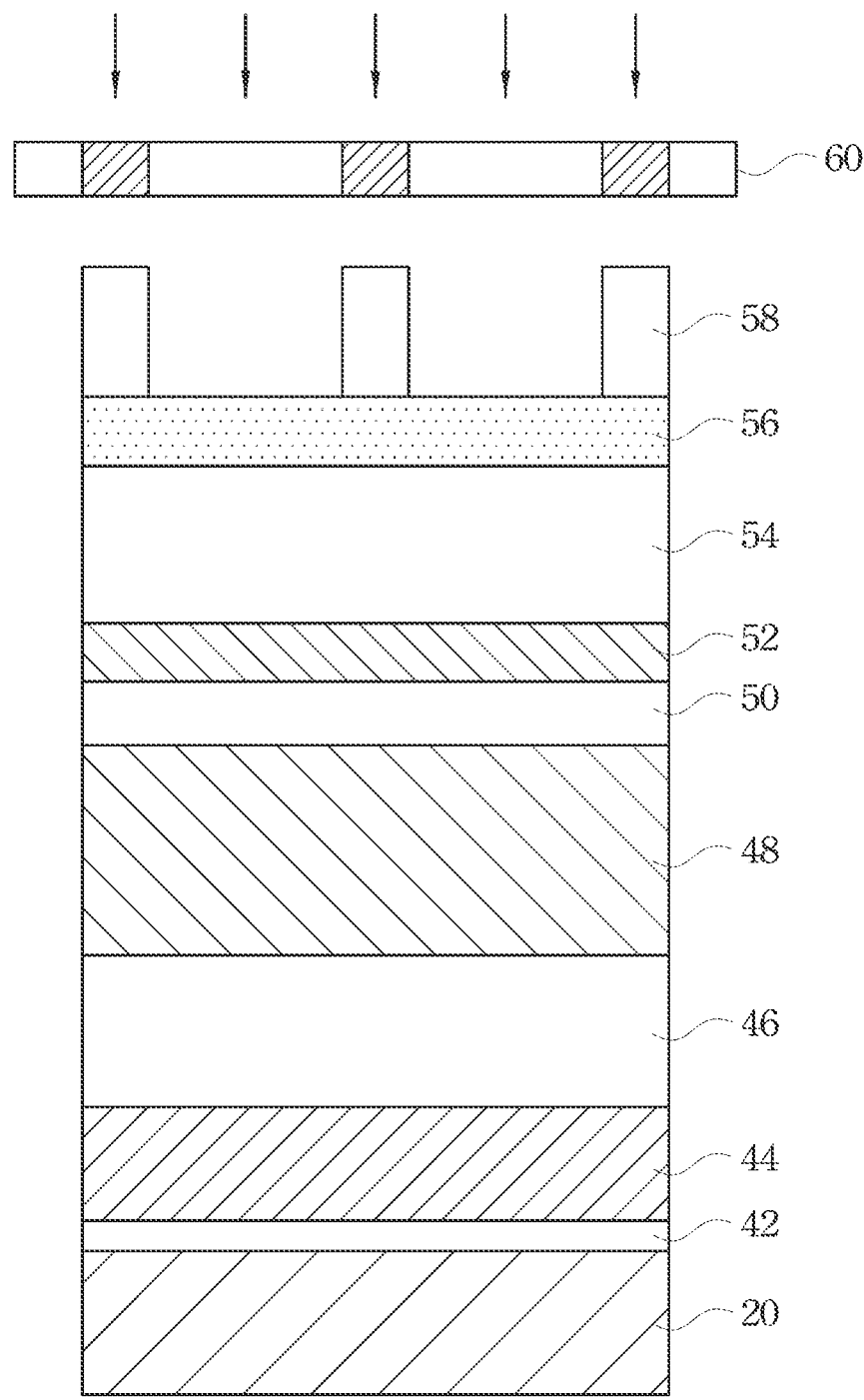
FIGS. 2 through 15 are cross-sectional views of intermediate stages in the manufacturing of semiconductor fins, intra-device shallow trench isolation (STI) regions, and inter-device STI regions.
Figure 3:
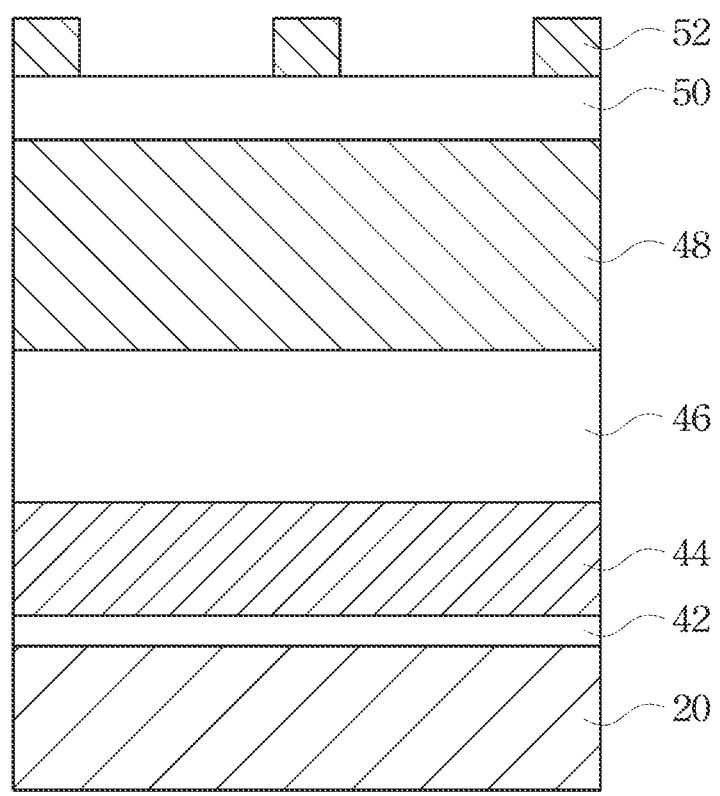
Figure 4:
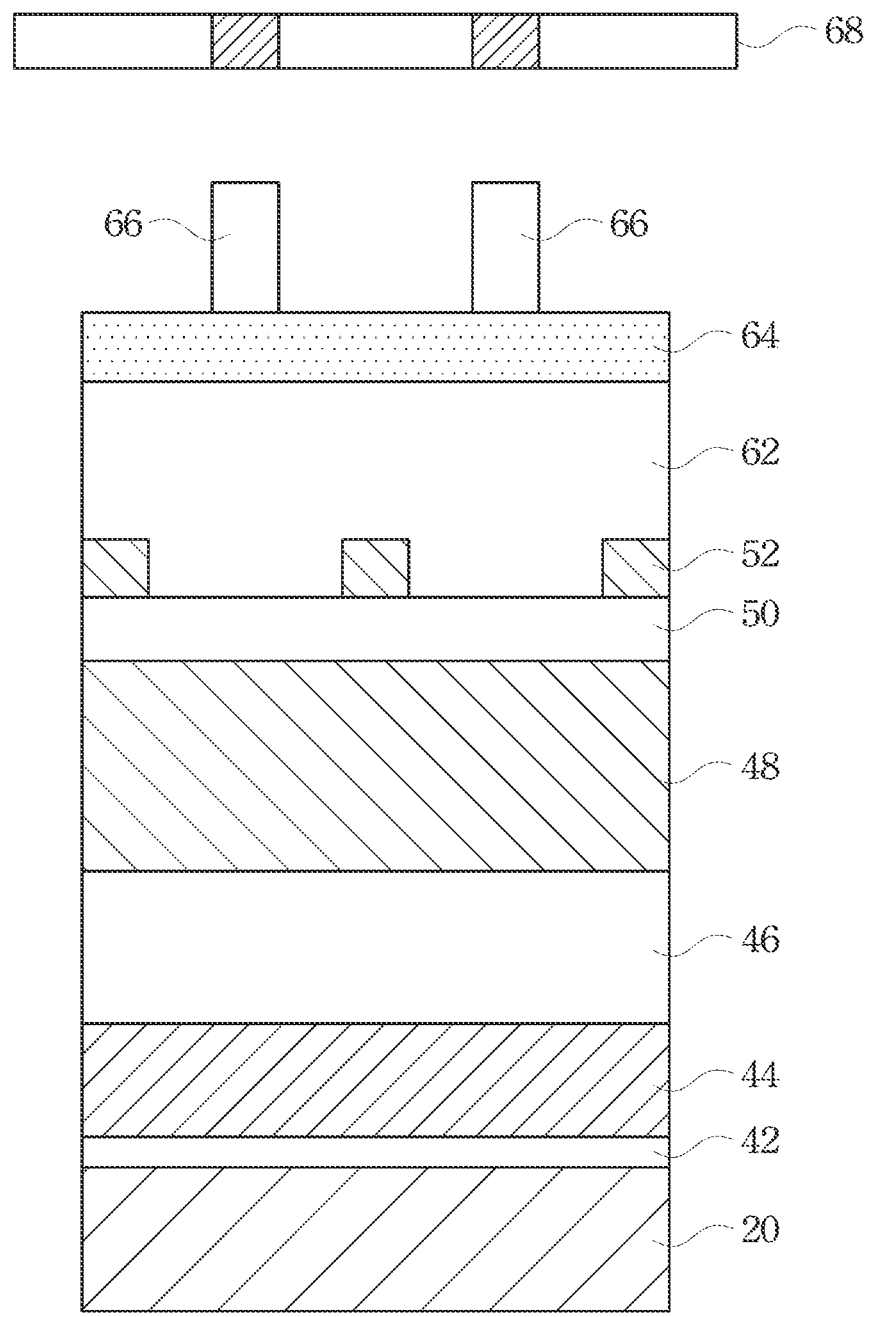
Figure 5:
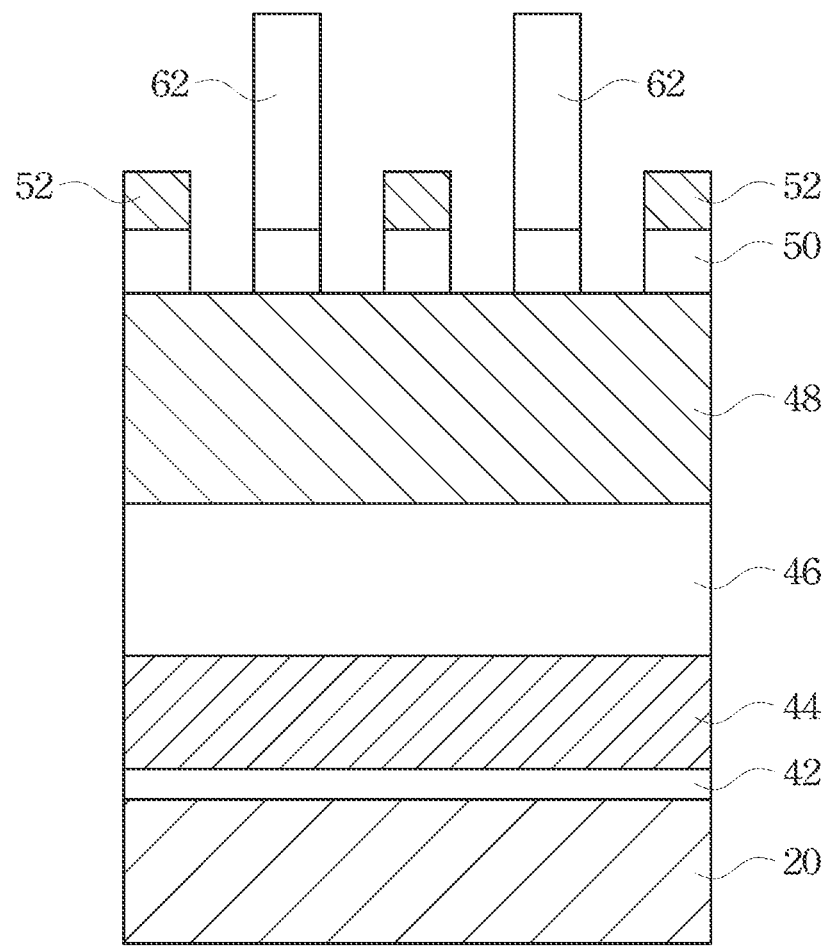
Figure 6:
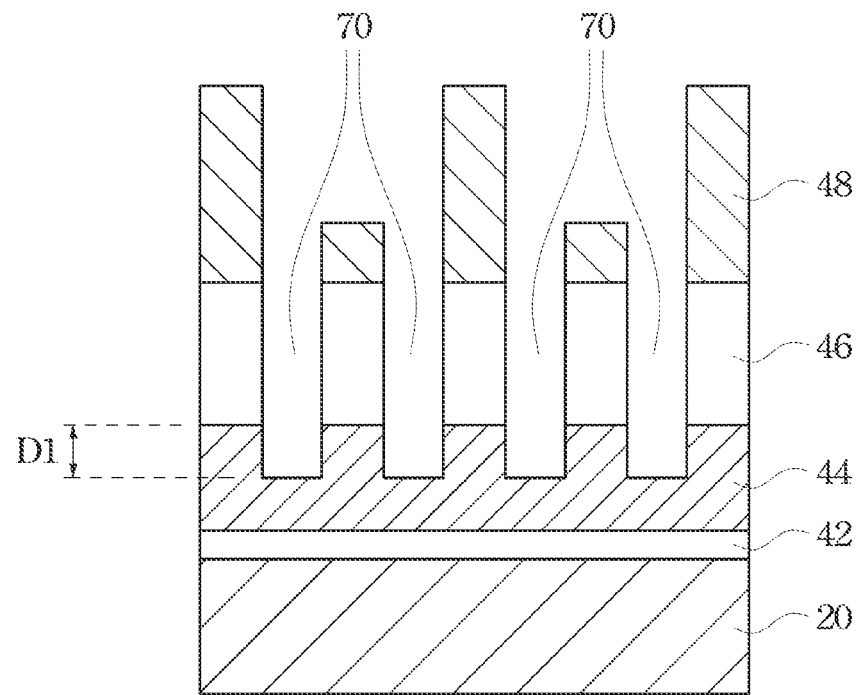

FIGS. 2 through 15 illustrate cross-sectional views of intermediate stages in the manufacturing of FinFET 10. FIGS. 2 through 6 illustrate the formation of double-patterning patterns, wherein FIGS. 2 and 3 illustrate the formation (and the removal) of photo resist 58 using a first lithography mask of a double-patterning mask set, and FIGS. 4 through 6 illustrate the formation (and the removal) of second photo resist 66 using a second lithography mask of the same double-patterning mask set. Referring to FIG. 2, substrate 20 is provided. Substrate 20 may be formed of a commonly used semiconductor material such as silicon, silicon germanium, or the like. In an embodiment, pad oxide layer 42 is formed on substrate 20. Hard mask layer 44 (which may be a silicon nitride layer) is formed over pad oxide layer 42. Plasma enhanced (PE) oxide layer 46, which may be a silicon oxide layer formed using plasma enhanced chemical vapor deposition (PECVD), is formed over hard mask layer 44. Ashing removable dielectric (ARD) 48, which may be formed of hydrocarbon, for example, is formed over PE oxide layer 46. In addition, PE oxide layer 50, silicon oxynitride layer 52, bottom layer 54, and middle layer 56 may be formed sequentially. Bottom layer 54 and middle layer 56 may be formed of carbon-doped polyimide, for example. Photo resist 58 is applied and patterned using lithography mask 60, which is a first lithography mask of a double-patterning mask set.

Next, as shown in FIG. 3, middle layer 56, bottom layer 54, and silicon oxynitride layer 52 are patterned, followed by the removal of photo resist 58 and layers 56 and 54. In FIG. 4, bottom layer 62 and middle layer 64 are formed, wherein bottom layer 62 and middle layer 64 may be formed of essentially the same materials as that of layers 54 and 56, respectively. Photo resist 66 is applied and patterned using lithography mask 68. Lithography masks 60 (FIG. 2) and 68 are masks of the same double-patterning mask set. After the patterning of bottom layer 62 and middle layer 64, photo resist 66 is removed, followed by the removal of middle layer 64, as shown in FIG. 5. By using the double-patterning technology, the pitch of the resulting fins 30 as shown in FIG. 1B may be reduced.

Figure 7:
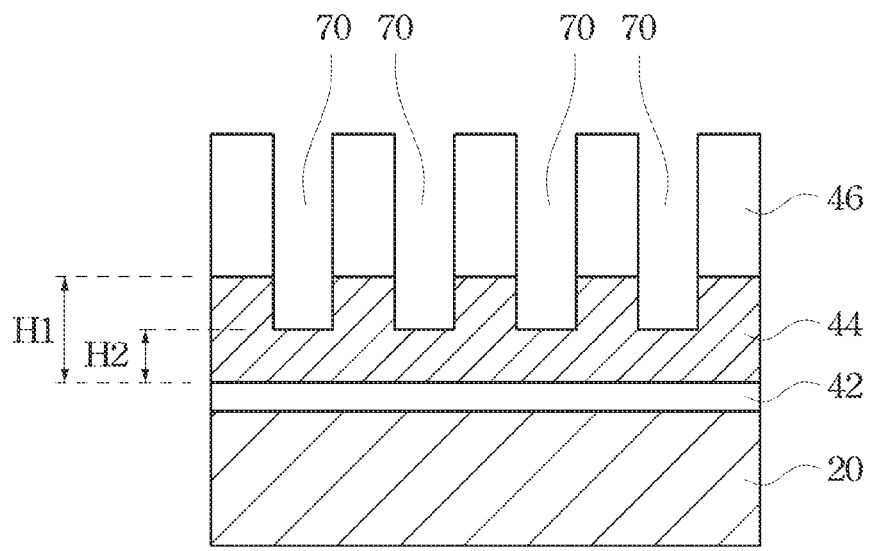

In FIG. 6, the patterns defined in the preceding process steps are transferred into ARD 48, PE oxide layer 46, and hard mask layer 44. The overlying layers 50, 52, and 62 are then removed. The remaining portions of ARD 48 are then removed, and the resulting structure is shown in FIG. 7. Openings 70 extend into hard mask layer 44 for depth D1. Accordingly, hard mask layer 44 includes first portions having first height H1, and second portions having second height H2. Depth D1 may be adjusted to adjust the ratio of height T2 to height T1 (please refer to FIG. 1B), as will be discussed in detail.

Figure 8:
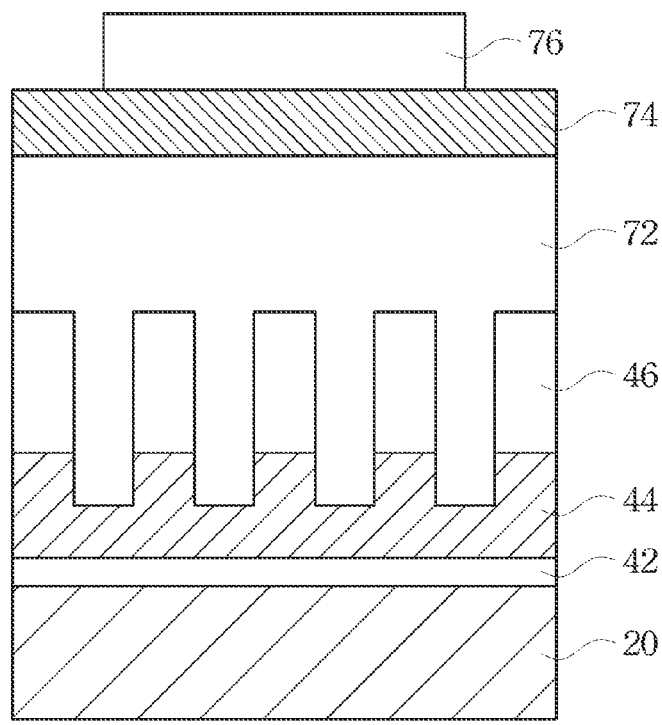
Figure 9:
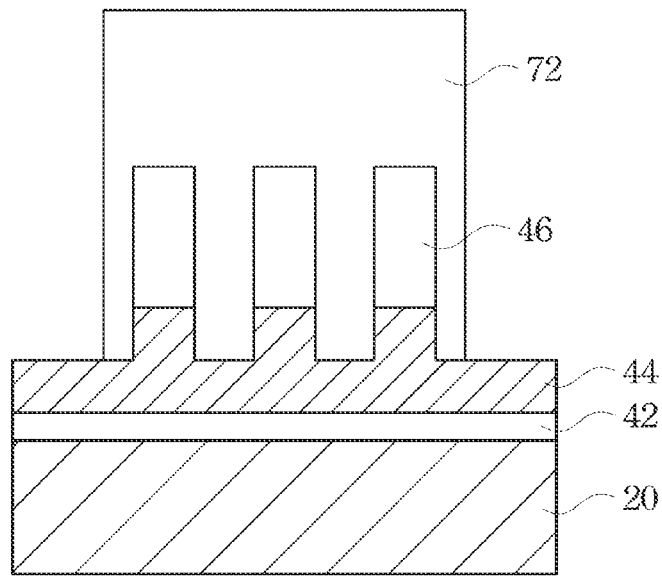
Figure 10:
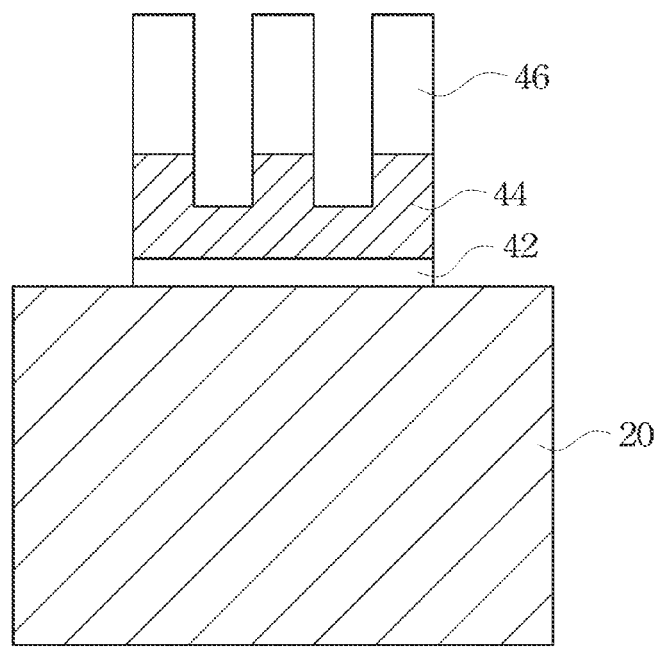

Next, as shown in FIG. 8, bottom layer 72 and middle layer 74 are formed, followed by the formation and the patterning of photo resist 76. Middle layer 74 and bottom layer 72 are then patterned, followed by the removal of middle layer 74, and the resulting structure is shown in FIG. 9. Bottom layer 72 is then used as a mask to etch exposed portions of hard mask layer 44 and pad oxide layer 42, while the portion of hard mask layer 44 covered by bottom layer 72 is protected. FIG. 10 illustrates the structure after the removal of bottom layer 72.

Figure 11:
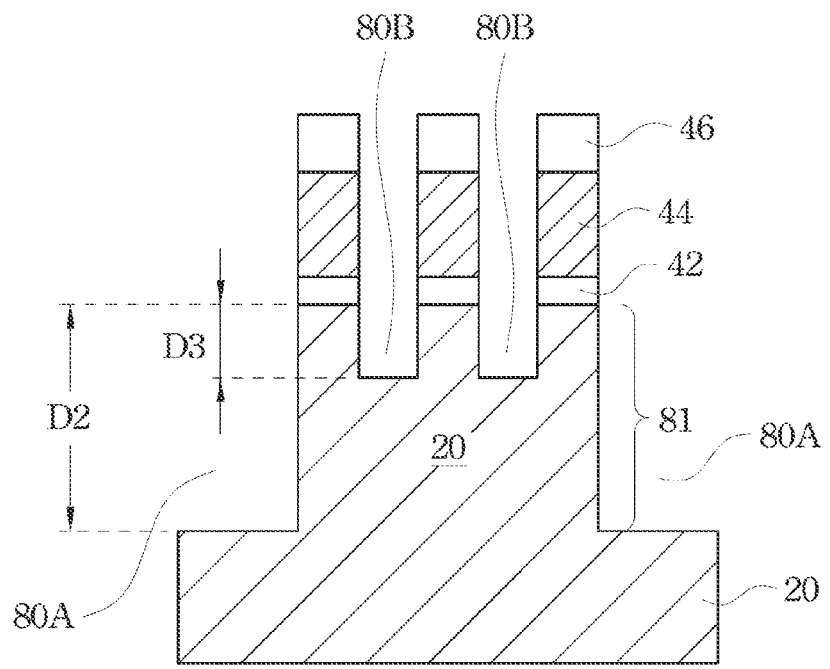

FIG. 11 illustrates the etching of substrate 20, for example, using an anisotropic etching method such as a dry etch. Inter-device STI openings 80A and intra-device STI openings 80B are hence formed. In the etching process, the first portions of substrate 20 not covered by hard mask layer 44 are etched more to depth D2 to form inter-device STI openings 80A. The second portions of substrate 20 covered by hard mask layer 44 and PE oxide layer 46 are not etched. The third portions of substrate 20 that are not covered by PE oxide layer 46, but are covered by hard mask layer 44 are also etched to form intra-device STI openings 80B, which have depth D3 smaller than depth D2. The crown OD 81 is thus formed. In an exemplary embodiment, depth D2 is greater than about 20 nm, and may be between about 20 nm and about 700 nm, while depth D3 is smaller than about 10 nm, and may be between about 10 nm and about 150 nm.

Figure 12:
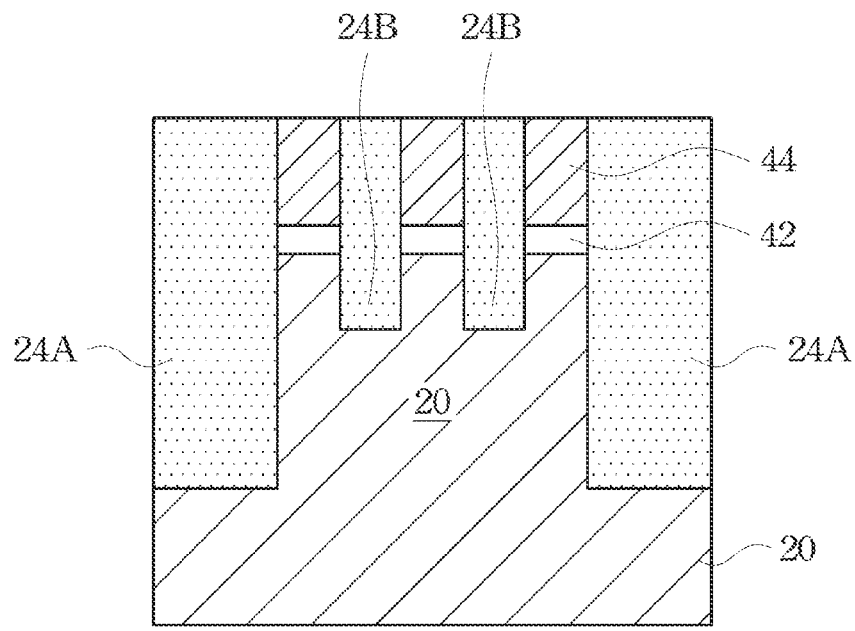
Figure 13:
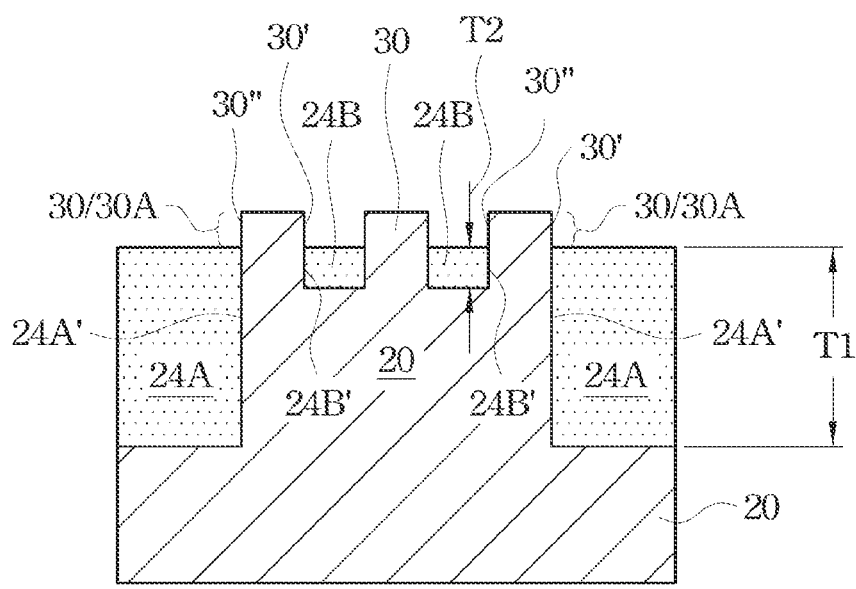

FIG. 12 illustrates the filling of a dielectric material, for example, an oxide, to form inter-device STI regions 24A and intra-device STI regions 24B. Next, hard mask layer 44 and possibly pad oxide layer 42 are removed, and STI regions 24A and 24B are etched back, so that remaining portions of substrate 20 that are above the top surfaces of STI regions 24A and 24B form fins 30. The resulting structure is shown in FIG. 13. It is observed that two of fins 30, which are marked as fins 30A, have sidewalls 30' vertically aligned to sidewalls 24A' of inter-device STI regions 24A, and sidewalls 30" vertically aligned to sidewalls 24B' of intra-device STI regions 24B. The structure shown in FIG. 13 corresponds to the structure shown in FIG. 1B, except gate dielectric 27 and gate electrode 26 have not been formed yet. In subsequent process steps, gate dielectric 27 and gate electrode 26 are formed, and the structure as shown in FIG. 1B is formed.

Figure 14:
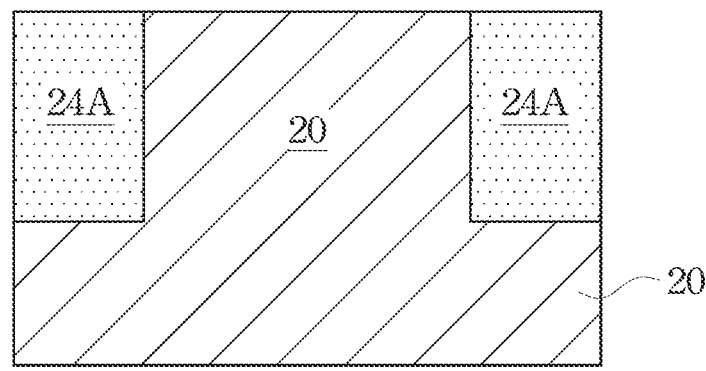
Figure 15:
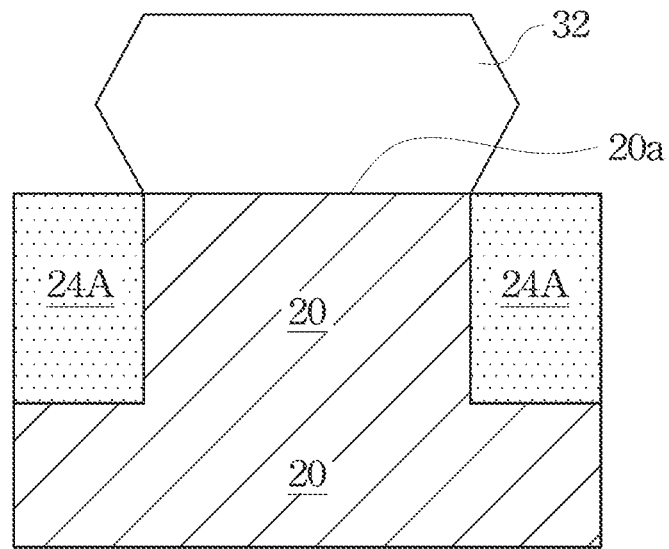

FIGS. 14 and 15 illustrate the formation of source/drain regions 32. The cross-sectional views shown in FIGS. 14 and 15 are obtained in the plane crossing line 1C-1C in FIG. 1A. Referring to FIG. 14, fins 30 and intra-device STI regions 24B are etched. It is noted that in this etching step, only portions of fins 30 that are not protected by gate electrode 26 and gate dielectric 27 (FIG. 1B) are etched, while portions of fins 30 directly under gate electrode 26 and gate dielectric 27 are not etched. Next, source/drain stressor region 32 is epitaxially grown from surface 10a of semiconductor substrate 20. In an exemplary embodiment, source/drain region 32 is formed of SiGe (for a p-type FinFET) or SiC (for an n-type FinFET). It is observed that since portions of intra-device STI regions 24B are removed in the step shown in FIG. 14, intra-device STI regions 24B do not extend into, or extend directly under, source/drain stressor region 32.

Figure 16:
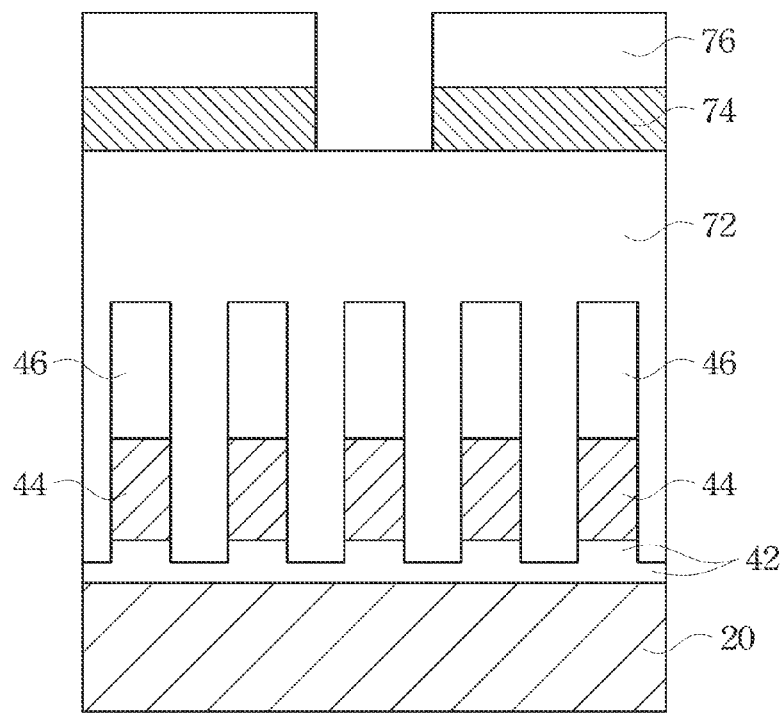
FIGS. 16 through 19 are cross-sectional views of intermediate stages in the manufacturing of semiconductor fins, intra-device STI regions, and inter-device STI regions in accordance with various other embodiments.
Figure 17:
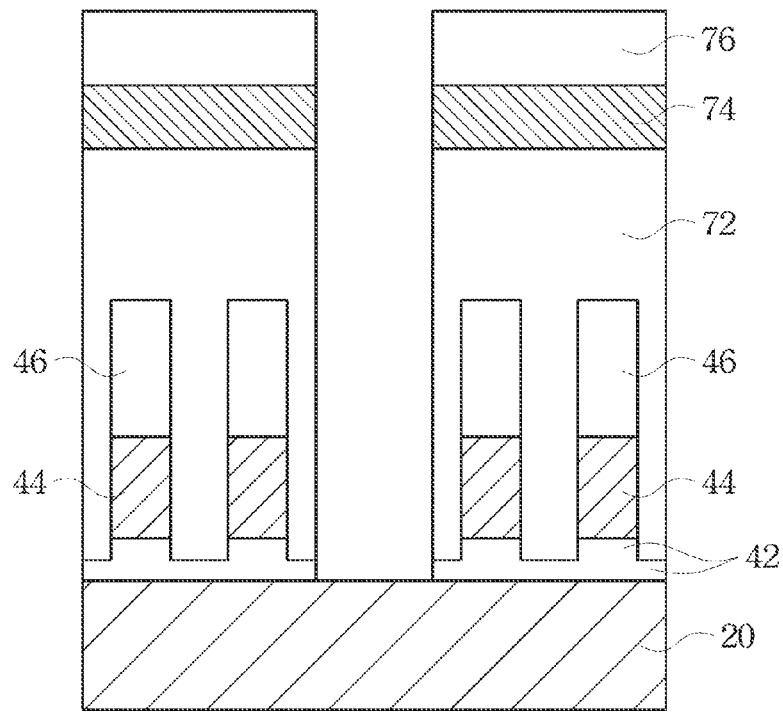
Figure 18:
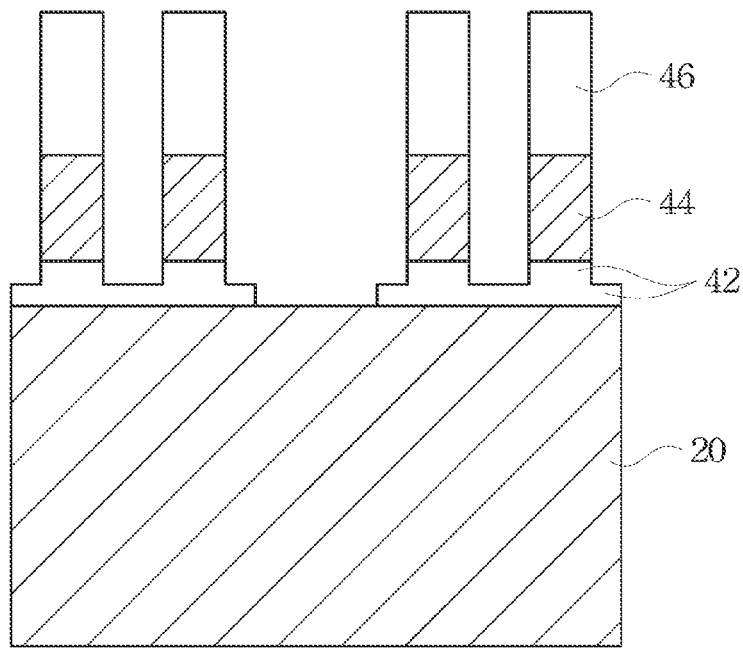

FIGS. 16 through 19 illustrate cross-sectional views of intermediate stages in the manufacturing of fins and STI regions in accordance with another embodiment. Unless specified otherwise, the materials and formation methods of the components in this embodiment are essentially the same as the like components, which are denoted by like reference numerals in the embodiment shown in FIGS. 2 through 15. The initial steps of this embodiment are essentially the same as shown in FIGS. 2 through 7, except pad oxide layer 42 may be partially patterned to a depth between the top surface and the bottom surface of pad oxide layer 42. Next, as shown in FIG. 16, bottom layer 72, middle layer 74, and photo resist 76 are formed, followed by the patterning of middle layer 74 and photo resist 76. In FIG. 17, portions of layers 44, 46, and 72 that are not protected by photo resist 76 are etched. Hence, opening 70 extends to the top surface of substrate 20. In FIG. 18, bottom layer 72, middle layer 74, and photo resist 76 are removed.

Figure 19:
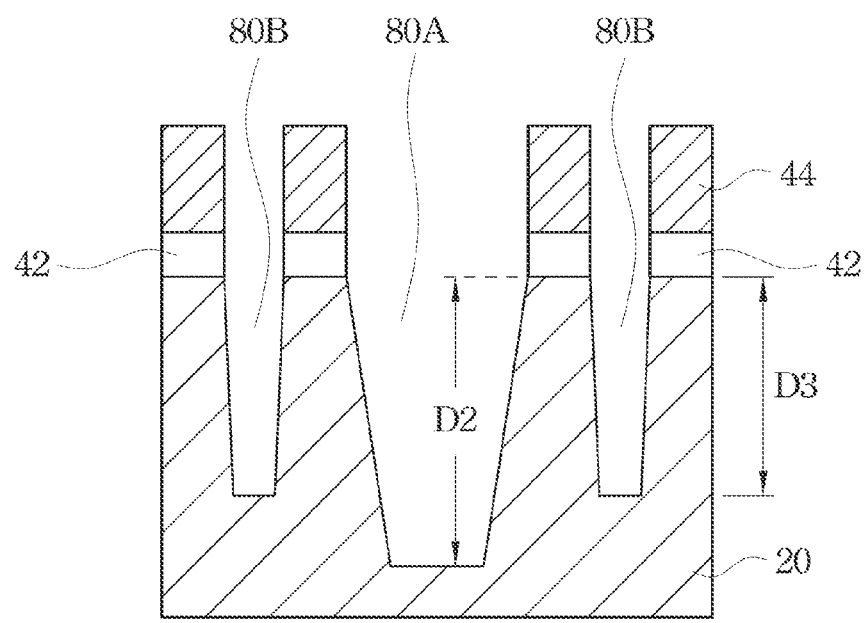

In FIG. 19, the remaining portions of pad oxide layer 42, hard mask layer 44, and PE oxide layer 46 are used as masks to form inter-device STI opening 80A and intra-device STI openings 80B, which have different depths D2 and D3. In subsequent steps (not shown), inter-device STI opening 80A is filled to form inter-device STI region 24A, and intra-device openings 80B are filled to form intra-device STI regions 24B. The subsequent process steps may be essentially the same as shown in FIGS. 12 through 15, and hence are not repeated herein.

In the embodiments, intra-device STI openings 80B have small depths. The gap-filling of intra-device openings 80B (refer to FIGS. 11 and 19) is thus easier, and voids are unlikely to occur in the resulting intra-devices STI regions 24B (FIG. 1B). Further, with the small depths T2 of intra-device STI regions 24B (FIG. 13), intra-device STI regions 24B may be easily removed before source/drain stressors are epitaxially grown. Accordingly, a bulk source/drain stressor having the size expanding across multiple fins may be formed, which means a greater stress may be applied to the channel region of the respective FinFET, and the device current of the FinFET may be improved.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method comprising:
   receiving a semiconductor substrate;
   etching the semiconductor substrate to simultaneously form a plurality of intra-device openings and a first and a second inter-device opening in the semiconductor substrate, wherein a first depth of the plurality of intra-device openings is less than a second depth of the first and the second inter-device openings;
   filling the plurality of intra-device openings to form a plurality of intra-device insulation regions, and filling the first and the second inter-device openings to form a first and a second inter-device insulation region, respectively, wherein the step of filling the plurality of intra-device openings and the step of filling the first and the second inter-device openings are performed simultaneously, and wherein the plurality of intra-device insulation regions are between the first and the second inter-device insulation regions;
   etching back the plurality of intra-device insulation regions and the first and the second inter-device insulation regions, wherein remaining portions of the semiconductor substrate above top surfaces of the plurality of intra-device insulation regions form a plurality of semiconductor fins;
   forming a gate dielectric on top surfaces and sidewalls of the plurality of semiconductor fins; and
   forming a gate electrode on the gate dielectric.

2. The method of claim 1, further comprising:
   prior to the step of etching the semiconductor substrate, forming a mask over the semiconductor substrate through a double patterning process.

3. The method of claim 2, wherein:
   the mask comprises a first portion and a plurality of second portions protruding over the first portion.

4. The method of claim 3, wherein:
   the first portion and the plurality of second portions form a crown shape.

5. The method of claim 1, wherein:
   the intra-device insulation regions do not extend outside the gate electrode.

6. The method of claim 1, wherein:
   a middle portion of each of the plurality of semiconductor fins is covered by the gate dielectric and the gate electrode.

7. The method of claim 6, further comprising:
   etching portions of the semiconductor fins and the intra-device insulation regions outside the gate electrode; and
   growing drain/source regions from the semiconductor substrate.

8. A method comprising:
   forming a first mask having a crown shape over a substrate through a double patterning process;
   depositing a second mask over the first mask;
   exposing a portion of the first mask by removing a portion of the second mask;
   applying a first etching process to the exposed portion of the first mask until a top surface of the substrate is exposed;
   removing the second mask;
   applying a second etching process to the substrate to form intra-device openings and inter-device openings, wherein a depth of the inter-device openings is greater than a depth of the intra-device openings;

filling the inter-device openings and the intra-device openings to form inter-device insulation regions and intra-device insulation regions; and etching back the inter-device insulation regions and the intra-device insulation regions to form a plurality of fins protruding over top surfaces of the inter-device insulation regions and the intra-device insulation regions.

9. The method of claim 8, further comprising:

depositing a gate dielectric layer on top surfaces and sidewalls of the plurality of fins; and depositing a gate electrode layer on the gate dielectric layer.

10. The method of claim 9, wherein:

the intra-device insulation regions do not extend outside the gate electrode layer.

11. The method of claim 9, further comprising:

etching portions of the plurality of fins and the intra-device insulation regions outside the gate electrode layer; and growing drain/source regions from the substrate.

12. The method of claim 8, wherein:

after the step of etching back the inter-device insulation regions and the intra-device insulation regions to form the plurality of fins protruding over top surfaces of the inter-device insulation regions and the intra-device insulation regions, a first sidewall of one of the plurality of fins is vertically aligned with a sidewall of one of the intra-device insulation regions and a second sidewall of the one of the plurality of fins is vertically aligned with a sidewall of one of the inter-device insulation regions.

13. The method of claim 8, wherein:

the crown shape comprises a horizontal portion and a plurality of vertical portions protruding over the horizontal portion, and wherein the vertical portions are spaced apart from each other.

14. A method comprising:

forming a first mask over a substrate through a double patterning process, wherein the first mask comprises a horizontal portion and a plurality of vertical portions protruding over the horizontal portion, and wherein the vertical portions are spaced apart from each other;

applying a first etching process to the first mask until a top surface of a portion of the substrate is exposed;

applying a second etching process to the substrate to form intra-device openings and inter-device openings, wherein the inter-device openings are formed at the exposed portion of the substrate;

filling the inter-device openings and the intra-device openings to form inter-device insulation regions and intra-device insulation regions;

etching back the inter-device insulation regions and the intra-device insulation regions to form a plurality of fins protruding over top surfaces of the inter-device insulation regions and the intra-device insulation regions; and forming a gate structure over the plurality of fins.

15. The method of claim 14, further comprising:

forming the gate structure by depositing a gate dielectric layer on top surfaces and sidewalls of the plurality of fins and depositing a gate electrode layer on the gate dielectric layer.

16. The method of claim 14, further comprising:

etching portions of the plurality of fins and the intra-device insulation regions outside the gate structure; and growing drain/source regions from the substrate.

17. The method of claim 14, wherein:

a bottom surface of one of the inter-device insulation regions is lower than a bottom surface of one of the intra-device insulation regions.

18. The method of claim 14, wherein:

a top surface of one of the inter-device insulation regions is level with a top surface of one of the intra-device insulation regions.

19. The method of claim 14, further comprising:

a fin has a first sidewall in direct contact with one of the intra-device insulation regions and a second sidewall in direct contact with one of the inter-device insulation regions.

20. The method of claim 14, wherein:

portions of the substrate directly underlying the vertical portions of the first mask are etched to form the plurality of fins.

* * * * *